United States Patent [19]

Kleinknecht

[11] Patent Number: 4,708,436
[45] Date of Patent: Nov. 24, 1987

[54] OPTICAL IMAGER WITH DIFFRACTIVE LENTICULAR ARRAY

[75] Inventor: Hans P. Kleinknecht, Bergdietikon, Switzerland

[73] Assignee: RCA Corporation, Princeton, N.J.

[21] Appl. No.: 754,134

[22] Filed: Jul. 12, 1985

[51] Int. Cl.$^4$ .................. G02B 5/18; G02B 27/44; H01J 40/14; H04N 3/14

[52] U.S. Cl. .................. 350/162.17; 250/578; 350/162.16; 350/162.2; 350/162.22; 358/213.13

[58] Field of Search .................. 350/162.17, 162.16, 350/162.2, 16.22, 162.24, 162.19; 250/578; 358/213.13

[56] References Cited

U.S. PATENT DOCUMENTS 3,631,360 12/1971 Lehovec .................. 331/94.5
4,036,552 7/1977 Lee et al. .................. 350/97
4,421,398 12/1983 Suzuki et al. .................. 354/200

FOREIGN PATENT DOCUMENTS 59-97103 6/1984 Japan .................. 350/162.2

OTHER PUBLICATIONS d'Auria, L., et al, "Photolithographic Fabrication of Thin-Film Lenses", *Optics Communications*, vol. 5, No. 4, Jul. 1972, pp. 232-235.

Genovese, F. C., et al, "Phase Plate Lens for a Multiple Image Lens System", *IBM Technical Disclosure Bulletin*, vol. 8, No. 12, May, 1966, pp. 1796-1797.

"Design and Performance of 64×128 Element PtSi Schottky-Barrier Infrared Charge-Coupled Device (IRCCD) Focal Plane Array", W. F. Kosonocky et al., SPIE, vol. 344, *Infrared Sensor Technology*, 1982, pp. 66-77.

"Silicon Cylindrical Lens Arrays for Improved Photoresponse in Focal Plane Arrays", H. G. Erhardt et al., SPIE, vol. 501, *State-of-the-Art Imaging Arrays and Their Applications*, 1984, pp. 165-172.

Primary Examiner—Bruce Y. Arnold
Assistant Examiner—D. Edmondson
Attorney, Agent, or Firm—Donald S. Cohen; Allen LeRoy Limberg

[57] ABSTRACT

An optical imager includes a sensor and a diffraction lenticular array. The sensor includes a substrate of a semiconductor material having a pair of opposed major surfaces and a plurality of photodetectors arranged in a plurality of columns along one of the major surfaces. The diffraction lenticular array includes a plurality of stripes of a material which will diffract the radiation being sensed. The stripes are arranged in a plurality of repetitive patterns with each pattern being formed of a plurality of spaced, parallel stripes extending longitudinally along a column of the detectors. The pattern of the stripes has a large spacing between the stripes at the center of the pattern and smaller spacing at the edges of the pattern. The stripes may be on a separate substrate of a material which is transparent to the radiation being detected or directly on the major surface of the semiconductor substrate.

15 Claims, 7 Drawing Figures

OPTICAL IMAGER WITH DIFFRACTIVE LENTICULAR ARRAY

The present invention relates to an optical imager with a diffractive lenticular array. More particularly, the present invention relates to a solid state optical imager, such as a charge-coupled device (CCD) imager, having associated therewith a diffractive lenticular array to improve the amount of light which is directed into the detector area of the imager.

BACKGROUND OF THE INVENTION

Solid state imagers generally include an array of photosensors which receive the light from the image being sensed and convert the light to electrons, and means for transferring the electrons generated in the photosensor to an output circuit of the imager. For example, one type of imager includes an array of Schottkybarrier detectors arranged in an array of rows and columns along the surface of a substrate of single crystalline silicon as the photosensors. Along each column of the detectors is a CCD shift register which receives the electrons from the detectors in the column and transfers the electrons to an output CCD register. Such an imager is shown and described in an article by W. F. Kosonocky et al. entitled "Design and Performance of 64×128 element PtSi Schottky-barrier Infrared Charge-coupled Device (IRCCD) Focal Plane Array", published in SPIE, Volume 344, *Infrared Sensor Technology* (1982), pp. 66-77. In such an imager, only the light which impinges on the detectors is converted to electrons, whereas the light impinging on the CCDs between the columns of detectors is lost. This reduces the efficiency of the imager.

One technique which has been developed to improve the amount of light which reaches the detectors is to provide means for directing the light away from the CCDs towards the detectors. The light directing means has been a lenticular array of cylindrical lenses formed on a transparent substrate and mounted on the surface of the imager substrate with each cylindrical lens being aligned with and extending along a column of detectors. Such an arrangement is shown in the article of H. G. Erhardt et al., entitled "Silicon Cylindrical Lens Arrays For Improved Photoresponse in Focal Plane Arrays", SPIE, Vol. 501, *State-of-the-Art Imaging Arrays and Their Applications*, (1984), pp. 165-172. Thus, light passing first through the lenses of the lenticular array is directed away from the CCDs and toward the detectors to increase the efficiency of the imager. A problem with this type of lenticular array is the difficulty in making the lenticular array and mounting it on the imager with the lenses aligned with the detectors. It has also been suggested to form the lenses of the lenticular array directly on the substrate of the imager with the imager being formed along one surface of the substrate and the lenses along the other surface of the substrate. However, this also raises a number of problems since no matter whether the imager or the lens is made first, forming the other can adversely affect the one made first.

SUMMARY OF THE INVENTION

An optical imager includes a substrate of semiconductor material having a pair of opposed major surfaces. An array of a plurality of radiation detectors is along one of the major surfaces of the substrate with each of the detectors being capable of converting radiation to electrons. A diffractive lenticular array is along the other major surface of the substrate. The lenticular array includes a plurality of diffractive lines having line widths and spacings such as to direct the radiation to the detectors.

DETAILED DESCRIPTION OF PREFERRED EMBODIMENTS

Figure 1:
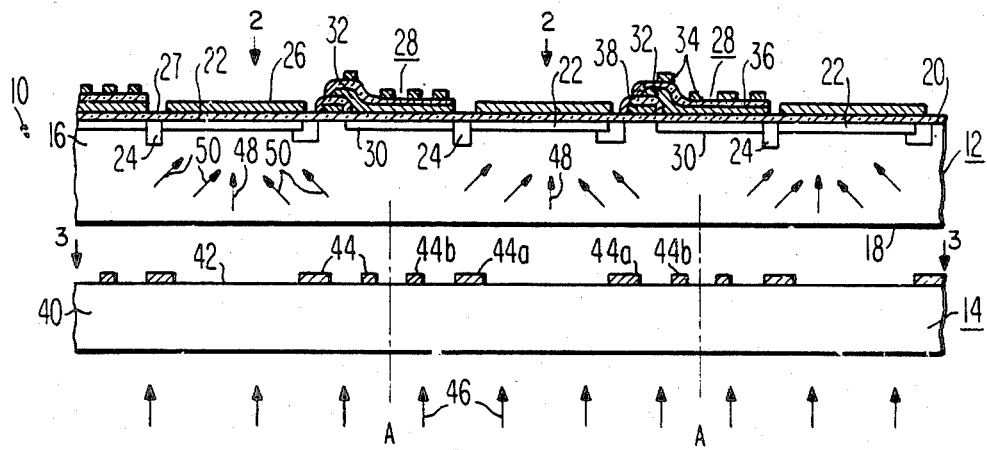
FIG. 1 is a sectional view of an embodiment of an optical imager which includes a lenticular array of the present invention.
Figure 2:
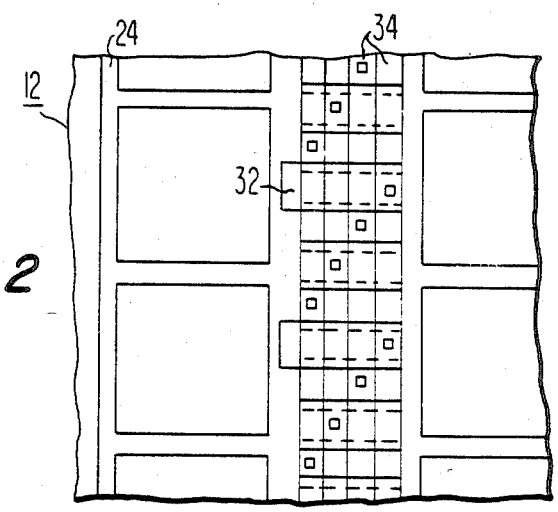
FIG. 2 is a top view of a portion of the optical imager taken along line 2—2 of FIG. 1.
Figure 3:
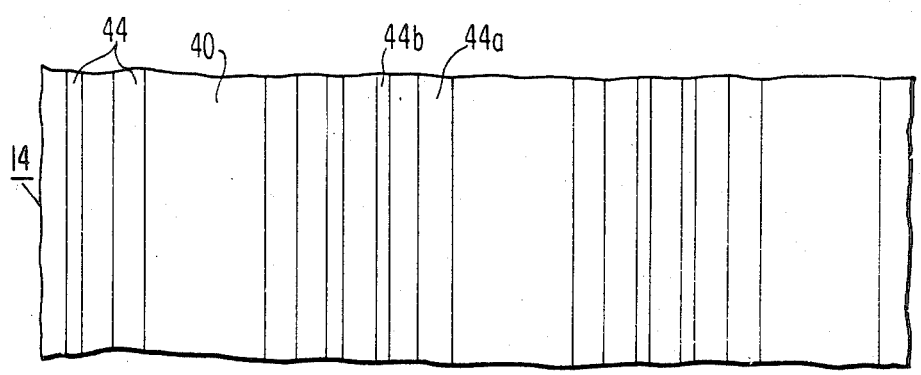
FIG. 3 is a top view of the lenticular array taken along line 3—3 of FIG. 1.

Referring to FIGS. 1-3, an optical imager which incorporates the present invention is generally designated as 10. Optical imager 10 includes a sensor, generally designated as 12, and a lenticular array, generally designated as 14. The sensor 12 illustrated includes a substrate 16 of semiconductor material, such as P type single crystalline silicon, having a pair of opposed major surfaces 18 and 20. Along the front surface 20 of the substrate 16 are a plurality of photodetectors 22 which are arranged in an array of columns and rows. Each photodetector 22 is a layer of a conductive material, such as platinum silicide, which forms a Schottky-barrier junction with the substrate 16. The photodetectors 22 are within the substrate 16 along the front surface 20. Surrounding each of the photodetectors 22 is a P+ type channel stop region 24. Each of the photodetectors 22 may also be surrounded by an N type guard ring, not shown. Over each of the photodetectors 22 is a layer 26 of a light reflective material, such as aluminum. The reflectors 26 are insulated from the detectors 22 by a layer 27 of an insulating material, such as silicon oxide, which covers the entire substrate surface 20.

Along the substrate front surface 20 and between the columns of photodetectors 22 are CCD shift registers 28. Each CCD register 28 includes an N type buried channel region 30 within the substrate 12 and extending along the surface 20. A plurality of gates 32 of a conductive material, such as doped polycrystalline silicon, are on the silicon oxide layer 27 and extend transversely across the channel region 30. The gates 32 are arranged in side-by-side relation along the entire length of the channel region 30. A plurality of spaced, parallel buss lines 34 of a conductive material, such as aluminum, are over the gates 32 and extend along the entire length of the channel region 30. The buss lines 34 are insulated from the gates 32 by a layer 36 of insulating material, such as silicon oxide. The buss lines 34 extend through openings in the silicon oxide layer 36 to contact separate ones of the gates 32. A transfer gate 38 of a conductive material, such as doped polycrystalline silicon, is on the silicon oxide layer 27 and extends along the portion of the substrate surface 20 between the buried channel 30 and the adjacent column of photodetectors 22. The transfer gate 38 serves to transfer the charges from the photodetectors 22 to the buried channel 30 of the adjacent CCD register 28.

The refractive lenticular array 14 includes a substrate 40 of a material which is transparent to the radiation being detected, such as glass or single crystalline silicon. On the surface 42 of the substrate 40 which is adjacent the back surface 18 of the sensor substrate 16 are a plurality of spaced, parallel stripes 44 of either an opaque or transparent material. Preferably, the stripes 44 are of a transparent material which has a high refractive index, such as zinc sulfide, which provide a true phase structure with a high efficiency. The stripes 44 are arranged in a repetitive pattern with each pattern extending along a separate column of pixels of the sensor 12. Each pixel includes a photodetector 22. In each pattern of the stripes 44, the line width, i.e. the width of the stripe 44, and the period, i.e. the spacing between stripes 44, is large in the center of the pattern and gets smaller moving in each direction from the center of the pattern toward the edge of the pattern. For example, as shown in FIGS. 1 and 3, a pattern is formed by the stripes 44 between the dashed lines A—A. In this pattern, the stripes 44a which are closest to the center of the pattern are spaced apart a relatively large distance, substantially the same width as the photodetectors 22, whereas the spacing between each of the stripes 44a and the next adjacent stripe 44b in the direction away from the center of the pattern is much smaller. Also, the stripes 44a are wider than the stripes 44b. This pattern results in a weak diffraction for the light falling on the center of the pattern and a stronger diffraction of the light incident closer to the edges of the pattern. The distribution of line widths and spacings of the stripes 44 can be designed such that with an incident plane wave, all first diffraction orders going towards the center of the pattern, will meet along one focal line. The theory for such a design can be obtained from a textbook on optics, such as M. Born and E. Wolf, "Principles of Optics", Pergamon Press, Oxford 1965.

The diffractive lenticular array 14 can be made by applying a layer of the material of the stripes 44 on the surface 42 of the substrate 40 using any well-known deposition technique for the particular material being used. A layer of a photoresist can then be coated over the material layer and, using standard photolithographic techniques, defined to form areas which extend over the portions of the material layer which will form the stripes. The uncovered portions of the material layer are then removed using any suitable etching technique to leave the stripes of the material on the substrate. The photoresist material can then be removed with a suitable solvent.

Another method of forming the lenticular array 14 is by the well known lift-off technique. For this technique a layer of photoresist is applied to the surface of the substrate and is defined, using standard photolithographic techniques, to have openings therein of the desired shape, size and location of the stripes 44. The material for the stripes 44 is then coated over the photoresist layer and on the surface of the substrate exposed by the openings in the photoresist layer. The photoresist is then removed with a suitable solvent which removes the material on the photoresist leaving the stripes 44 on the substrate.

The diffractive lenticular array 14 is positioned along the back surface 18 of the substrate 16 of the sensor 12 with the stripes 44 being adjacent the back surface 18 and being positioned with the open space between the stripes 44a of each pattern being aligned along a column of the detectors 22. The radiation being sensed, indicated by the arrows 46 in FIG. 1, first passes through the lenticular array 14 and then enters the sensor 12. The radiation passing through the space between the stripes 44a of each pattern passes directly through the substrate 16 of the sensor 12 to a detector 22 as indicated by the arrows 48. The radiation passing through the lenticular array 14 at each side of the center of each pattern is diffracted by the stripes 44 toward the center of the pattern, as indicated by the arrows 50, so that the radiation also flows towards a detector 22. Thus, a greater amount of the radiation reaches the detectors 22 so as to increase the efficiency of the imager 10.

Figure 4:
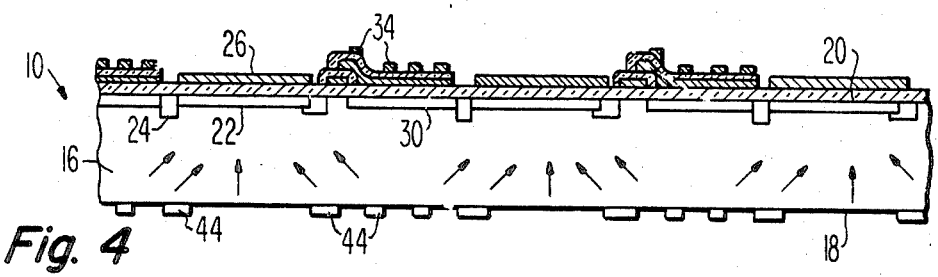
FIG. 4 is a sectional view of another embodiment of an optical imager which incorporates the lenticular array of the present invention.

In the imager 10 shown in FIGS. 1-3, the diffractive lenticular array 14 is formed on a substrate 40 which is separate from the substrate 16 on which the photodetectors 22 and CCD registers 28 are formed. This has the advantage that the lenticular array 14 and sensor 12 can be made separately and tested separately with only a good lenticular array 14 being assembled with a good sensor 12. However, since the lenticular array 14 is made using standard photolithographic techniques which are also used in making the sensor, it is possible, as shown in FIG. 4, to form the stripes 44 directly on the back surface 18 of the sensor substrate 16. This would make the imager 10 more compact. If desired, the exposed portions of the surface 18 of the substrate 16 can be coated with an anti-reflective coating.

Figure 5:
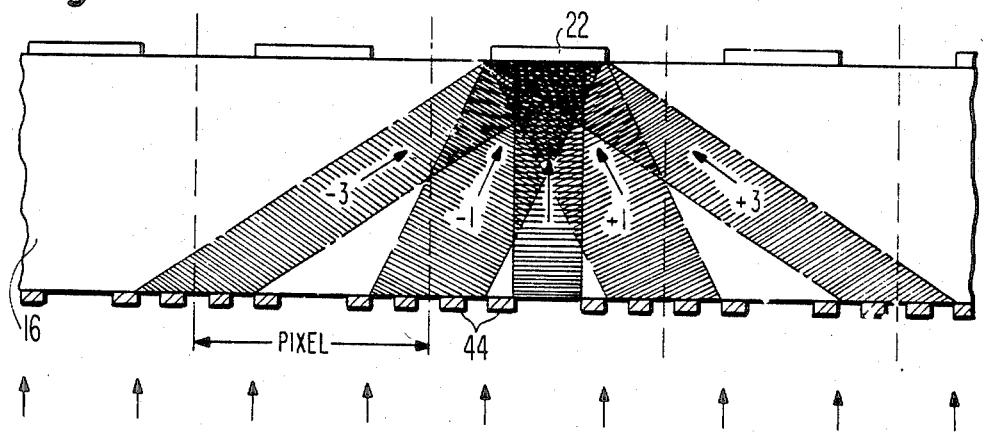
FIG. 5 is a sectional view of still another embodiment of an optical imager having a lenticular array of the present invention.

In the lenticular array 14 shown in FIGS. 1-3, the pattern of the stripes 44 is designed to diffract the radiation toward a common focal line. However, it is also possible to design the pattern to concentrate the radiation into an extended region, which in the case of an imager would be the region covered by the photodetectors 22. As shown in FIG. 5, this is accomplished by having a pattern of the stripes 44 which has a constant period grating near the edges of the pixels with a large bare space in the center of the pixel. The bare center portion allows the light passing therethrough to pass directly to the detector 22. The pattern with constant period grating at the edges utilizes not only the light passing directly to the detector through the bare center portion, but it diffracts the positive and negative first orders to the detector area 22 adjacent to the grating towards the right and left hand side of the grating area, respectively. Similarly, the positive and negative third orders are diffracted to the detector areas next to the adjacent grating, the fifth orders are diffracted to the second next detector areas and so on for all odd orders. The even orders and the zero orders can be minimized by designing the thickness and width of the stripes 44 in the manner which will be described later. This provides a higher efficiency of detection.

Figure 6:
FIG. 6 is a sectional view of another embodiment of a lenticular array of the present invention.

It is known that a convex lens can be flattened by introducing steps into the lens structure as indicated by the dashed lines 52 in FIG. 6. This type of structure can be achieved in another embodiment of the present invention by forming over each of the stripes 44 a second stripe 54 which is narrower than the first stripe 44. The edges of the stripes 54 and 44 are aligned along the sides of the stripes which are toward the center of the pattern. Although this two layer structure is more difficult to make, it provides a greater efficiency of the diffraction of the radiation toward the center of the pattern and thus to the photodetectors.

Figure 7:
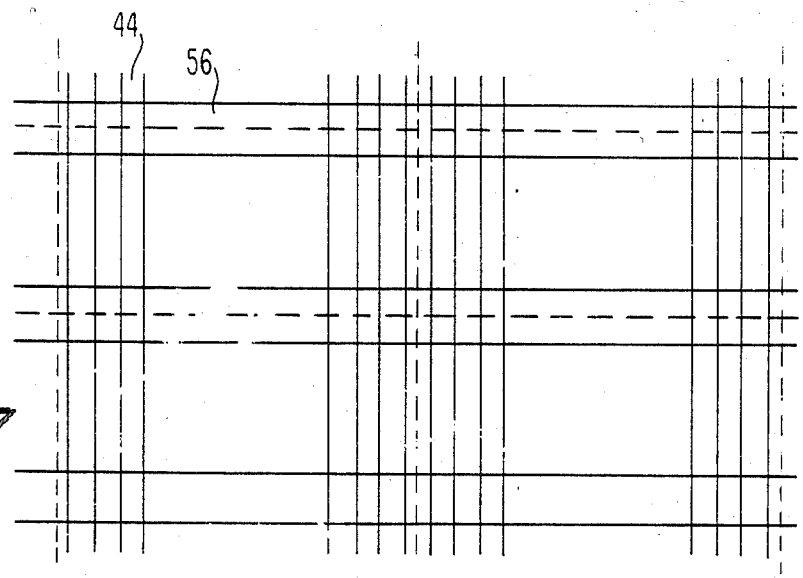
FIG. 7 is a top view of still another embodiment of the lenticular array of the present invention.

The diffractive lenticular array 14 shown in FIGS. 1-3 is a one dimensional array in that it focuses the radiation onto long lines extending in one dimension. Although the major area of the sensor 12 in which radiation may be lost is in the areas of the CCD register 28 which extend in one dimension, there is also some blank space between the rows of the photodetectors 22 where radiation may be lost. The lost radiation in the blank spaces between the rows of photodetectors 22 can be minimized or eliminated by providing a second diffractive lenticular array which, as shown in FIG. 7 includes a pattern of stripes 56 which extend perpendicular to the stripes 44. The stripes 56 are positioned and designed to deflect radiation which may pass into the spaces between the rows of photodetectors 22 into the photodetectors. The stripes 56 of the second diffractive lenticular array may be on a second transparent substrate, may be on the opposite surface of the substrate 40, or may be on the same surface 42 of the substrate 40 as the stripes 44, or may be on the back surface of the sensor substrate 16.

In designing any of the forms of the diffractive lenticular array 14 for the image sensor 10 of the present invention, the following conditions should be followed:

1. The grating period must vary with position of the stripes such that at least one-half of all first diffraction orders coming from various points on the array are directed to the desired light-sensitive area.
2. The zero diffraction order must be minimized by choosing the thickness of the stripes 44 to be $$T = \frac{\lambda}{2(n-1)}$$

where
T=thickness
λ=the wavelength of the radiation being detected
n=the refractive index of the material of the stripes
3. The second diffraction orders and other even orders must be minimized by making the width of the stripes and the adjacent spaces approximately equal.
4. The period at the pixel edges must vary smoothly.

EXAMPLE

A diffractive lenticular array of the present invention was made for a CCD imager of the construction shown in FIGS. 1 and 2 which had a pixel size of 80 micrometers by 40 micrometers, a photodetector area of 40 micrometers by 23 micrometers and operated at a wavelength of about 4 micrometers. The lenticular array was made by coating one surface of a double-side polished substrate of single crystalline silicon with a 3 micrometer layer of a positive photoresist. The photoresist layer was defined using standard photolithographic techniques to form openings therein corresponding to the pattern of the diffractive stripes to be formed on the substrate. Each pattern had a center spacing between grooves of about 41.5 micrometers, groove widths of about 5.5 micrometers and spacing between grooves at the edges of the pattern of about 5.5 micrometers. The exposed surface of the substrate surface was cleaned with an oxygen plasma etch. A layer of zinc sulfide was then deposited on the photoresist layer and on the surface of the substrate exposed by the openings in the photoresist layer by evaporation in a vacuum. The zinc sulfide, which has an index of refraction of 2.274 at the wavelength of 4 micrometers, was applied to a thickness of 1.57 micrometers. The photoresist layer was then removed with a suitable solvent. This removed the zinc sulfide layer on the photoresist leaving the stripes of zinc sulfide on the substrate. A silicon oxide single layer anti-reflection coating was then deposited on both surfaces of the substrate.

I claim:

1. An optical imager comprising:
   a substrate of semiconductor material having a pair of opposed major surfaces;
   a plurality of radiation detectors which are arranged in a plurality of evenly spaced parallel columns along one of said major surfaces, with each of said detectors being capable of converting radiation to electrons; and
   a diffractive lenticular array along the other major surface of the substrate, said lenticular array including a plurality of diffractive lines parallel to said columns of radiation detectors, said diffractive lines having line widths, spacings and thickness such as to suppress even orders of diffraction including the zeroeth order, thus to direct the radiation impinging on each of the diffraction gratings these diffractive lines form to the detectors in a plurality of said columns and away from between any of these columns.

2. An optical imager in accordance with claim 1 in which the diffraction lines are parallel stripes of a material which will diffract the radiation.

3. An optical imager in accordance with claim 2 in which the stripes are arranged in patterns repeating in the direction perpendicular to said columns of radiation detectors and evenly spaced the same as said columns, with the spacing between stripes in each pattern being large at the center of the pattern and narrower at the edges of the pattern, with the large center spacing of each pattern being aligned with a respective column of radiation detectors.

4. An optical imager in accordance with claim 3 in which the center spacing of the stripes in each pattern is approximately the same as the width of the detectors and the width of the stripes and the spacing between the stripes at the edges of the pattern are equal.

5. An optical imager in accordance with claim 2 in which the width of the stripes and the spacing between the stripes varies decreasingly from the center of the pattern toward the edges of each pattern.

6. An optical imager in accordance with claim 5 in which the spacing between the stripes is substantially equal to the width of the adjacent stripes.

7. An optical imager in accordance with claim 2 in which the stripes are on the surface of a second substrate of a material which is transparent to the radiation being detected with the second substrate being positioned adjacent the other major surface of the semiconductor substrate.

8. An optical imager as set forth in claim 7 wherein there are pluralities of radiation detectors in each of said spaced parallel columns, which detectors are arrayed in rows across said columns; and wherein, upon a surface of said second substrate opposite that positioned adjacent to said other major surface of said semiconductor substrate, there is disposed
   a further lenticular array including a plurality of further stripes of a material which will diffract the radiation and which parallel said rows of detectors, said further stripes having widths and spacings such as to direct radiation to the rows of detectors and away from spaces between those rows, said further stripes being arranged in a plurality of repetitive patterns repeating in the direction perpendicular to the rows of detectors, with the spacings between further stripes being large in the center of each pattern and narrower at the edges of each pattern, and with the further stripes of each pattern extending along a separate row of the detectors with the large center spacing being aligned with the detectors.

9. An optical imager as set forth in claim 7 wherein there are pluralities of radiation detectors in each of said spaced parallel columns, which detectors are arrayed in rows across said columns; and wherein on said other surface of said semiconductor substrate, there is disposed a further lenticular array including a plurality of further stripes of a material which will diffract the radiation and which parallel said rows of detectors, said further stripes having widths and spacings such as to direct radiation to the rows of detectors and away from spaces between those rows, said further stripes being arranged in a plurality of repetitive patterns repeating in the direction perpendicular to the rows of detectors, with the spacings between further stripes being large in the center of each pattern and narrower at the edges of each pattern, and with the further stripes of each pattern extending along a separate row of the detectors witht the large center spacing being aligned with the detectors.

10. An optical imager in accordance with claim 2 in which the stripes are on the other major surface of the semiconductor substrate.

11. An optical imager as set forth in claim 10 wherein there are pluralities of radiation detectors in each of said spaced parallel columns, which detectors are arrayed in rows across said columns; wherein there is a second substrate of a material which is transparent to radiation and has first and second major surfaces parallel to the major surfaces of said substrate of semiconductor material; and wherein a further diffractive lenticular array is disposed along one of the major surfaces of said second substrate, said further lenticular array including a plurality of further stripes of a material which will diffract the radiation and which parallel said rows of detectors, said further stripes having widths and spacings such as to direct radiation to the rows of detectors and away from spaces between those rows, said further stripes being arranged in a plurality of repetitive patterns repeating in the direction perpendicular to the rows of detectors, with the spacings between further stripes being large in the center of each pattern and narrower at the edges of each pattern, and with the further stripes of each pattern extending along a separate row of thě detectors with the large center spacing being aligned with the detectors.

12. An optical imager in accordance with claim 2 in which the thickness of the stripes equals. $\lambda/2(n-1)$, where $\lambda$ is the wavelength of the radiation being detected and n is the refractive index of the stripe material.

13. An optical imager in accordance with claim 2 in which each diffraction line includes a second diffractive stripe on each of said first stripes with the second stripe being narrower than the first stripe on which it is positioned.

14. An optical imager comprising:
a substrate of semiconductive material having first and second opposed major surfaces;
a diffractive lenticular array along the first major surface of said array including a plurality of stripes of diffractive material having respective thicknesses and widths, said stripes being disposed parallel to each other and being separated by spacings exhibiting a repeating pattern of relatively wide spacings interspersed with gratings of stripes, the grating period being chosen so that most of the radiation entering the first major surface of said substrate and falling into first order diffraction impinges on the columnar areas near the second major surface of said substrate and opposite to the relatively wide spacings on the first major surface of said substrate, the thicknesses of the stripes being chosen to minimize the zero-order diffraction, and the widths of the stripes being chosen to minimize even diffraction orders, particularly the second diffraction order; and
a plurality of radiation detectors arranged in each of said columnar areas near the second major surface of said substrate and opposite the relatively wide spacings on the first major surface of said substrate 15. An optical imager in accordance with claim 14 in which the thickness of the stripes equals $\lambda(2(n-1)$ where $\lambda$ is the wavelength of the radiation being detected and n is the refractive index of the stripe material.

* * * * *